United States Patent [19]
Fleming

[11] 3,975,690
[45] Aug. 17, 1976

[54] PLANAR TRANSMISSION LINE COMPRISING A MATERIAL HAVING NEGATIVE DIFFERENTIAL CONDUCTIVITY

[75] Inventor: Paul L. Fleming, Rockville, Md.

[73] Assignee: Communicatons Satellite Corporation (Comsat), Washington, D.C.

[22] Filed: Sept. 2, 1975

[21] Appl. No.: 609,657

Related U.S. Application Data

[63] Continuation-in-part of Ser. No. 512,574, Oct. 7, 1974, abandoned.

[52] U.S. Cl. .................................. 330/5; 330/53; 357/3
[51] Int. Cl.² .......................................... H03F 3/04
[58] Field of Search ......................... 330/5; 357/3

[56] References Cited
UNITED STATES PATENTS

| | | | |
|---|---|---|---|
| 3,648,185 | 3/1972 | Acket et al. | 330/5 |
| 3,796,964 | 3/1974 | Baynham | 330/5 |
| 3,833,858 | 9/1974 | Gandhi et al. | 330/5 |

*Primary Examiner*—R. V. Rolinec
*Assistant Examiner*—Darwin R. Hostetter
*Attorney, Agent, or Firm*—Sughrue, Rothwell, Mion, Zinn & Macpeak

[57] ABSTRACT

A planar transmission line comprising a Gunn effect semiconductor having an epitaxial portion as the propagating medium amplifies and switches r.f. signals and is not transit time limited in the direction of propagation. The spacing between the transmission line conductors and the dopant concentration of the Gunn effect semiconductor are selected to prevent the formation of domains and thereby prevent Gunn oscillations from occurring at E fields above the Gunn threshold.

12 Claims, 22 Drawing Figures

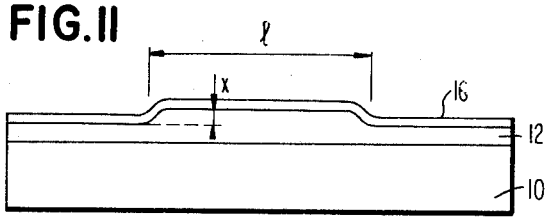
FIG.11
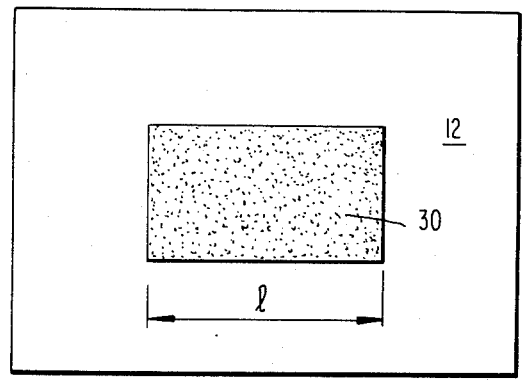
FIG.12
FIG.13A
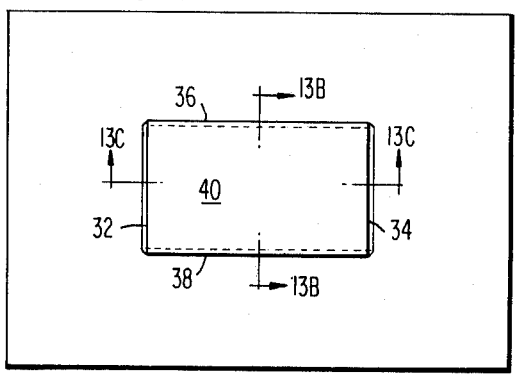
FIG.13C
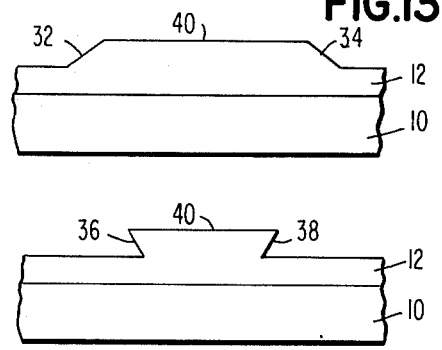
FIG.13B
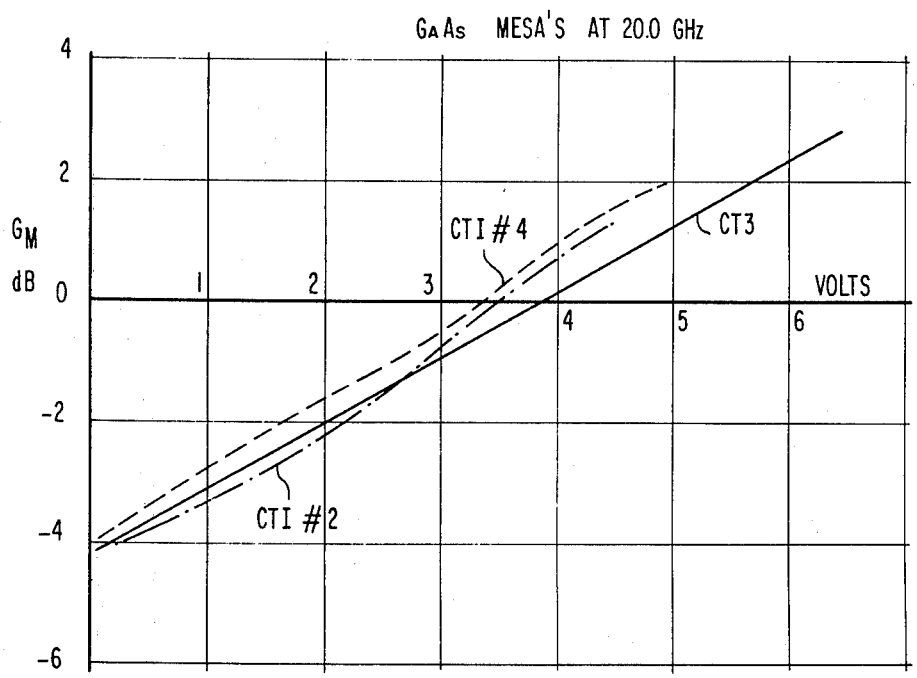
FIG.14

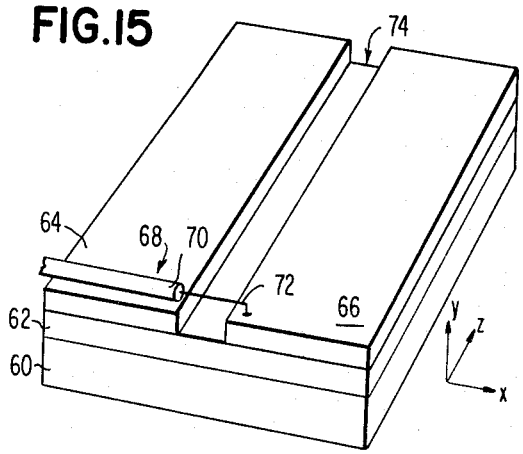
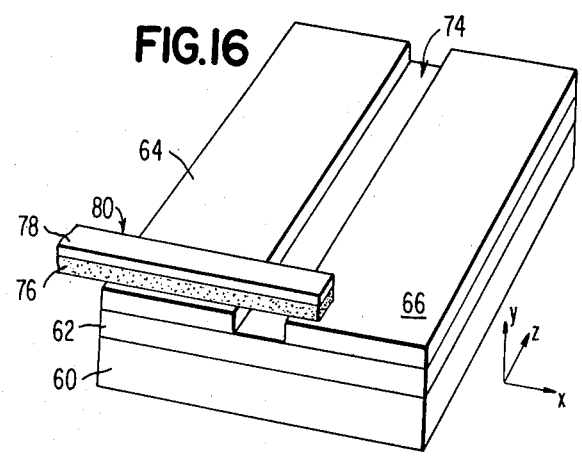
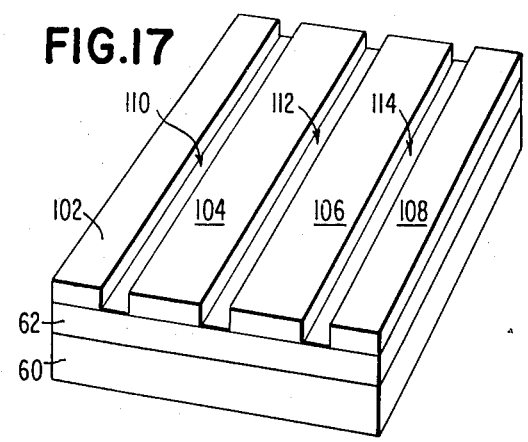
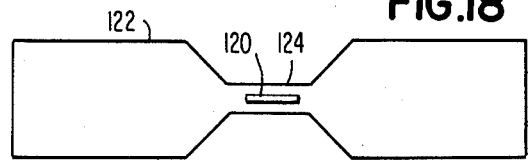
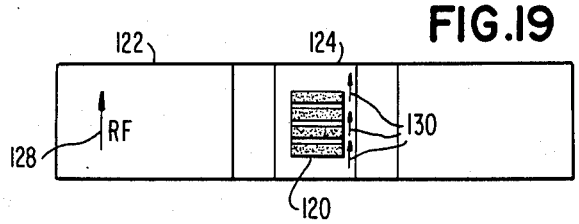
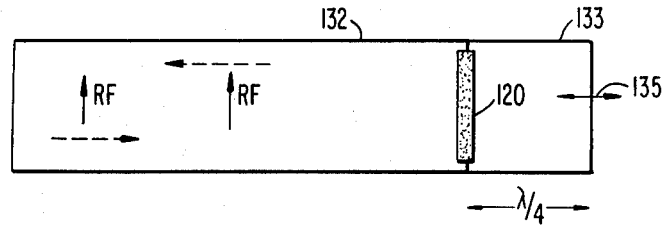

PLANAR TRANSMISSION LINE COMPRISING A MATERIAL HAVING NEGATIVE DIFFERENTIAL CONDUCTIVITY

RELATED APPLICATIONS

This application is a continuation-in-part of Ser. No. 512,574, filed Oct. 7, 1974, now abandoned.

BACKGROUND OF THE INVENTION

The invention is in the field of amplification devices using materials having negative differential conductivity, and in particular is a planar transmission line (i.e., co-planar or slot line) comprising planar electrodes on an epitaxial layer of Gallium Arsenide. The line is biased above the Gunn threshold of the material and the $n \cdot L$ product is selected to suppress the formation of domains.

The activity of electromagnetic waves in solid state microwave transmission lines can be explained in terms of Maxwell's equations. See "Description of Dielectrics by Various Sets of Parameters" at pp. 9–13, of the publication "Dielectric Materials and Applications" edited by Von Hippel, MIT Press. Microwave solid state transmission lines are well known in the art and they may take such forms as planar transmission lines, microstrip, etc. Basically, such devices comprise metal conductors and an associated dielectric material. The input/output voltage relationship for a microwave transmission line is:

$$V_{out} = V_{in} e^{-j(\omega/c) \sqrt{\epsilon_c} \, l} \qquad (1)$$

where;

$V_{in}$ is the input voltage,
$V_{out}$ is the output voltage,
$\omega$ is the radian frequency of the voltage,
$c$ is the speed of light, and
$\epsilon_c$ is the complex dielectric constant.

The term $c\omega \sqrt{\epsilon_c}$ is defined as the propagation constant, K, of the medium. Typically, one is looking for a transmission line which will have low loss. Consequently, perfect dielectrics are sought wherein the conductivity, $\delta$, approaches zero. This results in $\epsilon_c$ and K being real numbers only. The output voltage becomes:

$$V_{out} = V_{in} e^{-jKl} \qquad (2)$$

Since K is a real number, the exponential is imaginary and has no real part. Consequently, the difference between $V_{in}$ and $V_{out}$ is only in the phase shift. Materials which have conductivities substantially different than zero, such as semiconductors, are lossy dielectrics and are not usually favored as transmission lines.

If one were to use a material having a differential conductivity, $\delta$, which is negative in the region above the Gunn threshold, the equation for $V_{out}$ becomes:

$$V_{out} = V_{in} e^{-j\omega/c \sqrt{\epsilon + j|\sigma|/\omega\epsilon_0} \, l}$$

When we take the square root of a complex term with $a + j$, we get a complex term having a real part, $R_e$, and an imaginary part, $+jL_m$. Thus, $$V_{out} = V_{in} e^{-j(\omega/c)(jXR_e + jL_m)l},$$

which can be written as:

$$V_{out} = V_{in} e^{\alpha l} e^{j\beta l}.$$

where $\alpha$ is real and positive. The $e^{\alpha l}$ is the real part and represents amplification. It can be appreciated that the amplification increases with increased $l$.

The term bulk semiconductor as used herein and as used conventionally in the art, refers to a semiconductor device which does not have a barrier. For example, transistors, junction diodes, Esaki diodes, etc. are semiconductor devices whose characteristics are dependent to some extent on the barrier interface between n-type and p-type conductivity materials.

An example of a bulk semiconductor is a simple slab of silicon or germanium, or gallium arsenide, etc. Typically, when the term device is used in combination with bulk semiconductor, one is referring to some active electronic element whose characteristics depend on the properties of the bulk semiconductor material. A Gunn diode is a bulk semiconductor device. (It should be noted that the term diode simply refers to a two terminal device, no p-n junction is implied.)

A substantial amount of research in recent years has been directed toward the investigation of properties of so-called double valley semiconductors. These are semiconductors, such as GaAs and other III-V compounds, which have lower and upper conduction band valleys in momentum space separated in energy. In an article by J. B. Gunn, entitled "Instabilities of Current in III-V Semiconductors", IBM Journal of Research and Development, Vol. 8, No. 2, April, 1964 (this article is typically noted as the first publication of the Gunn effect), the author noted instabilities in the current-voltage characteristics of III-V compounds. He noted that at some particular voltage, $V_T$, subsequently known as the Gunn threshold, the current reaches maximum and a further voltage increase results in current instabilities. He also noted that the current fluctuations take the form of oscillations of a well defined period and are based upon the transit time of electrons between the electrodes.

Subsequent work by Gunn and others has resulted in a presently accepted explanation for the Gunn effect. See, for example, "Bulk Negative-Resistance Semiconductor Devices" by John Copeland, IEEE Spectrum, May, 1967. An oversimplified explanation will be given here to aid the reader, but for an accurate and detailed explanation reference should be made to the numerous publications in the field. Also, the explanation will be given for GaAs since most of the work has been done with that semiconductor. It will be understood that the explanation is applicable to other materials.

Reference is made to FIGS. 1 and 2 which are extracted from the above-mentioned Copeland article. FIG. 1 is a plot of the average carrier drift velocity in cm/sec $\times 10^6$ versus the applied electric field in kV/cm for n-type GaAs. As can be seen, the drift velocity of the carriers (electrons) decreases at electric fields above $\approx$ 3kV/cm. The latter is known as the Gunn threshold of n-type GaAs. The explanation of the dip in the $V_e$ (drift velocity) curve is the so-called double-valley theory which Copeland attributes to Ridley, Watkins and Hilsum.

The semiconductor has lower and upper conduction band valleys, as shown in FIG. 2. These valleys are separated by 0.35 electron volts. Those electrons in the lower valley have higher mobility than those in the upper valley. At room temperature with no applied E field, almost all of the electrons are in their low energy states and the average drift velocity is zero. When a small E field is applied the electron distribution shifts so that more electrons are moving with the field than against it. The average drift velocity of the electron stream increases with increasing electric field until the fraction of electrons with energy greater than 0.35 eV begins to increase rapidly. Electrons with energy greater than 0.35 eV transfer to the more numerous states in the upper valleys where they have the same energy but much less average velocity. At the Gunn threshold, about 3,000 V/cm, the average electron drift velocity reaches a maximum value of $20 \times 10^6$ cm/sec. At higher fields the electrons are mostly in the upper valleys and the average velocity decreases to a more or less constant value of $8 \times 10^6$ cm/sec.

The electron mobility $\mu$ is dependent upon the drift velocity ($\mu = (v/E)$) and the conductivity $\delta$ is dependent upon the mobility $\mu(\delta = n\mu e)$. Thus, in the region of the negative slope of the drift velocity versus field curve the bulk exhibits a negative differential mobility and a negative differential conductivity. This is often referred to as the negative resistance region of the bulk GaAs. However, as will be recalled from above, the I-V curve does not show a negative slope above the Gunn threshold; it exhibits instabilities.

Remembering that the Gunn diode is a two-terminal device consisting of two ohmic contacts to a bar or piece of n-type GaAs, or other suitable semiconductor, it will be appreciated that electrons entering the semiconductor at the negative terminal travel across the device to the positive terminal. A space charge builds up near the cathode because of the reverse dielectric-relaxation effects. In effect, electrons enter the space charge region near the cathode and emerge from the space charge region and traverse the semiconductor to the anode. Measurements by Gunn showed that as the voltage was increased past the threshold, the space charge build up becomes so great the high field domains are formed near the cathode. The cause of the space charge build up is attributed to the negative resistivity which in turn is attributed to the double valley model. The high field domains reduce the electric field in the rest of the diode and cause the current to drop to about two-thirds of the maximum value. The high field domain then drifts with the carrier stream across the sample and disappears at the anode contact. As the old domain disappears at the anode, the electride field behind it increases (to keep the voltage, $vEdx$, constant) until the threshold field is reached and the current increases back to the threshold value. At this time a new domain forms at the cathode, the current drops, and the cycle begins anew.

An example of the current waveform thus produced is shown in FIG. 3. The flat valley occurs as the domain drifts across the sample. The upward spikes begin as a domain reaches the anode, and a new domain forms at the cathode.

The time between current pulses is $\tau_t$, so that $1/\tau_t$ is the fundamental frequency of oscillation of a Gunn diode. By proper biasing and control of external circuitry, a Gunn diode can be operated as an oscillator or amplifier at the fundamental frequency or at other frequencies. One other mode of operating the same type of device is known as LSA mode, and is described by Copeland in his paper "LSA Oscillator — Diode Theory" in the Journal of Applied Physics, Vol. 38, No. 8, July, 1967.

In order to prevent confusion due to nomenclature certain terms should be cleared up. As used herein the following terms have the following meaning:
Gunn effect: The exhibition of negative differential conductivity in a semiconductor having the double valley conduction band.
Gunn material: A material which exhibits the Gunn effect.
Gunn oscillations: The oscillations in a device exhibiting the Gunn effect when the device is biased above the Gunn threshold field.
Gunn diode: A two terminal bulk semiconductor device having ohmic contacts and exhibiting Gunn oscillations.
LSA diode: A Gunn diode operated in the limited space charge accumulation mode.

While Gunn diodes have been found useful as high frequency oscillators and amplifiers they are relatively noisy and are transit time limited. The latter means that the response of such devices drops off with increasing frequency for frequencies higher than the reciprocal of the transit time of domains from the cathode to the anode.

According to Watson, when bulk GaAs has an $n \cdot L$ product of $\lesssim 10^{12}$, the device may be d.c. stable and will not exhibit Gunn oscillations. The reason for this is explained in, "Microwave Semiconductor Devices and Their Circuit Applications" by Watson, McGraw Hill, 1969, pp. 501–505. Such a two-terminal device is known to exhibit amplification bands at the transit time frequency and its harmonics.

Gunn diodes are two terminal devices and are to be distinguished from transmission lines. Two terminal devices may affect a signal but there is no distinction between input and output per se. In a transmission line there are at least two ports. One at the input and one at the ouput. The voltage applied to the input port travels down the line to the ouput port. The voltage at the output port may or may not differ in amplitude and phase from the input voltage depending upon what takes place in the line. In a two-terminal device there is no distinction between input and output voltages. There are only two terminals connecting the device to the outside world and a voltage can only exist across these two terminals.

Two port devices utilizing the negative differential conductivity of GaAs to amplify microwaves have been taught by Robson, Kino and Fay in "Two-Port Microwave Amplification in Long Samples of Gallium Arsenide", IEEE Transactions on Electron Devices, Sept. 1967, pp. 612–615. In the device shown in FIG. 1, an elaborate arrangement is provided for coupling the r.f. to the bulk device. The $n \cdot L$ product is maintained low enough to prevent domain formation. Variations of the Robson et al amplifier design are found in Acket et al., U.S. Pat. No. 3,648,185 and Gandhi et al. U.S. Pat. No. 3,833,858. In the latter patents, different techniques are taught for suppressing domain formation. However, each has in common with Robson the feature that the microwave is coupled into the semiconductor to propagate in a direction parallel to the E field. Such devices are unilateral in operation because they operate by converting, by transducer, the microwave into a space charge, amplifying the space charge, and reconverting the amplified space charge into a microwave. Since the space charge grows only in the direction from cathode to anode, the device is unilateral (the bias field defines the cathode and anode).

A different mode of operation has been taught by Baynham in the following references:
1. Baynham, U.S. Pat. No. 3,796,964;
2. "Wave Propagation in Negative Differential Conductivity Media: n-Ge", by Baynham, *IBM Journal of Research and Development*, Vol. 13, No. 5, September, 1969;
3. "Emission of TEM Waves Generated Within an n-Type Ge Cavity", Electron Letters, 1970, 6, pp. 306–307 by Baynham; and
4. "New Mode of Microwave Emission From GaAs", Electronics Letters, Aug. 6, 1970, Vol. 6, No. 16, pp. 498–500, by Baynham and Colliver.

Baynham achieves a true transmission line amplification effect in bulk semiconductor materials. The device is two-port, but unlike the Robson et al devices, the direction of propagation is perpendicular to the direction of the space charge wave. The Baynham transmission lines are microstrip transmission lines, having an $n \cdot L$ product below that which permits domain formation.

SUMMARY OF THE INVENTION

The invention is a planar transmission line comprising a semiconductor material of the type which exhibits the Gunn effect and at least two conducting planes forming ohmic contact with the Gunn semiconductor layer. The two conductive planes are positioned with respect to the Gunn layer so that a distance of L of the Gunn layer lies between them in such a configuration that a d.c. voltage applied across the two conductors will result in an electric field of V/L across the distance L of the Gunn layer. The Gunn layer is doped to a concentration n so that the $n \cdot L$ product is low enough to prevent domains from forming in the Gunn layer. An r.f. signal applied across the two conductors at one end thereof will propagate through the Gunn layer and be amplified. The invention differs from the transmission line taught by Baynham in that it is a planar transmission line as opposed to the parallel plate transmission line. Furthermore, as contrasted with the bulk material used by Baynham the structure has an active region consisting of a doped epitaxial layer having a doping profile that drops off sharply into a semi-insulating region. The length of the subject invention is not limited to λ/2 and multiples as suggested by Baynham. Also, because the devices are planar, the $n \cdot L$ is not constant in the active region; whereas in the parallel plate devices used by Baynham the $n \cdot L$ is constant.

BRIEF DESCRIPTION OF THE DRAWINGS

FIG. 11 is a cross-sectional view of the device shown in FIG. 10.

FIG. 12 is a top view illustrating one stage in the fabrication of the device shown in FIG. 10.

FIGS. 13A, 13B and 13C illustrate the mesa etch used in connection with the device of FIG. 10.

FIG. 14 is a plot of gain versus d.c. voltage for several samples configured as shown in FIG. 10.

FIG. 15 is a perspective view of a slot line active medium propagation device with a coaxial input line.

FIG. 16 is a perspective view of a slot line active medium propagation device with a microstrip input line for coupling input signals thereto.

FIG. 17 is a perspective view of parallel slot line active medium propagation devices. FIGS. 18 and 19 are top and front views, respectively, of a rectangular waveguide in combination with the device of FIG. 17.

FIG. 20 is a side view of a rectangular waveguide in combination with a device of FIG. 17.

DETAILED DESCRIPTION OF THE PREFERRED EMBODIMENTS

Figure 4:
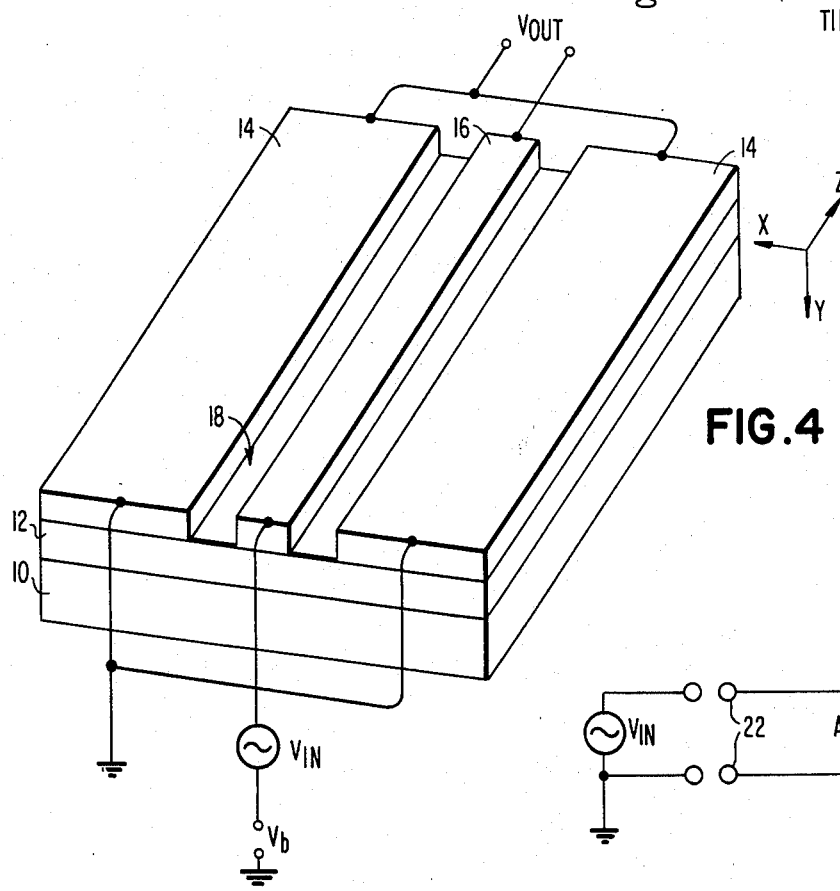
FIG. 4 is a perspective view of a co-planar configured active medium propagation device.

One example of the invention in a co-planar configuration is illustrated in FIG. 4. The device comprises a center conductor 16 and ground planes 14 overlying and forming a low resistance ohmic contact with the transmission medium 12. The transmission medium comprises a layer of semiconductor material of the type which exhibits the Gunn effect. A preferred material is gallium arsenide. Other known materials include indium phosphide, zinc telluride, cadmium telluride, indium arsenide (under mechanical stress), and germanium (at temperatures $\leq 17°K$). The Gunn effect layer 12 may be supported on any suitable substrate 10. In the preferred case, where gallium arsenide is used, layer 12 is an epitaxial layer of gallium arsenide grown on a layer of semi-insulating gallium arsenide 10. The gallium arsenide is n-type and has a dopant concentration, n, which will be described more fully hereafter.

Figure 5:
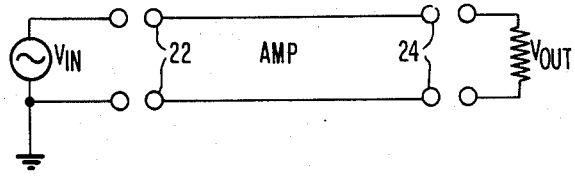
FIG. 5 is a schematic representation of the device of FIG. 4.

The Gunn effect layer 12 is biased by application of the bias voltage, $V_b$, as shown schematically in FIG. 4. The input r.f. signal, shown as $V_{in}$, is applied between the center conductor 16 and ground planes 14. A schematic representation of the transmission line is shown in FIG. 5. The input ports are shown at 22 and the output ports are shown at 24. The d.c. bias voltage is not shown. As is well known the voltage between conductors due to the d.c. bias is uniform throughout the length of the line. However, the r.f. signal travels down the line and is altered by the properties of the line.

Figure 6:
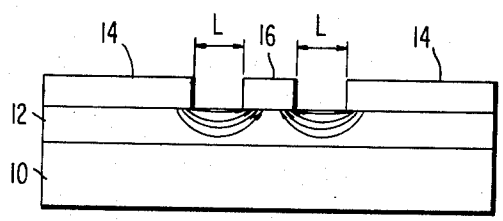
FIG. 6 is a cross-sectional view of the device of FIG. 4.

A cross-section of the device shown in FIG. 6 illustrates the E field through the gallium arsenide resulting from the bias voltage. The arrows represent the E field. It will be appreciated that for a given voltage applied the E field is greatest near the surface of the gap and decreases with depth. This is primarily due to the longer distance over which the applied voltage is dropped with increasing depth.

Figure 1:
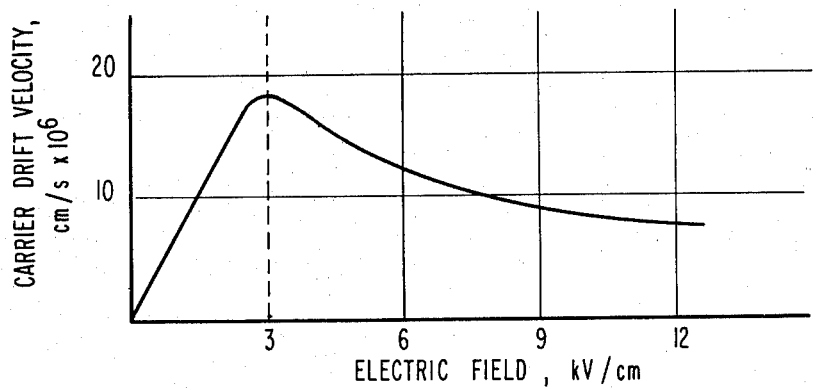
FIG. 1 is a plot of average drift velocity of electrons in gallium arsenide.
Figure 2:
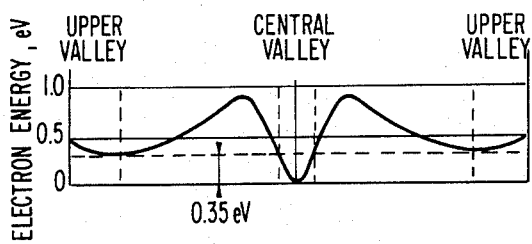
FIG. 2 is a pictorial representation of the double valley conduction band in GaAs.
Figure 3:
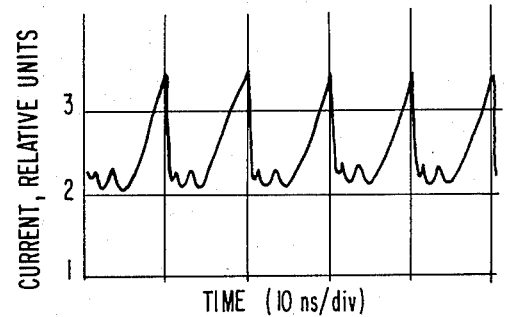
FIG. 3 is an oscillograph of Gunn oscillations.

Referring back to the curve of drift velocity in FIG. 1 it will be appreciated that the surface of the gap is at the Gunn threshold when $V_b = (E_g/L)$, where $E_g$ is the Gunn threshold and $L$ is the gap width. To bias substantially all of the gallium arsenide epitaxial layer in the gap, the bias voltage should be raised to a minimum of about twice that of the Gunn threshold in the gap.

Figure 7:
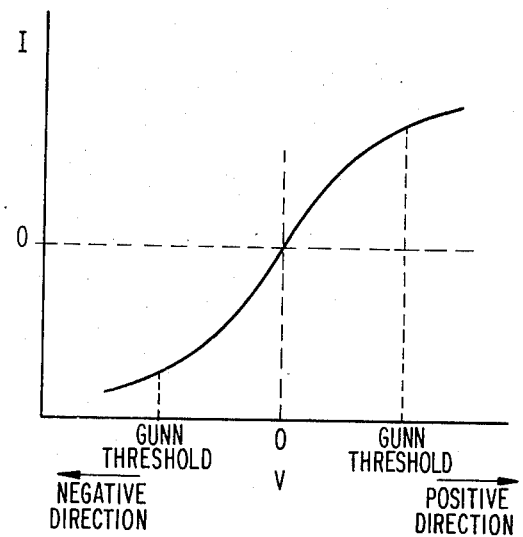
FIG. 7 is a plot of current versus voltage for an active medium propagation device.
Figure 8:
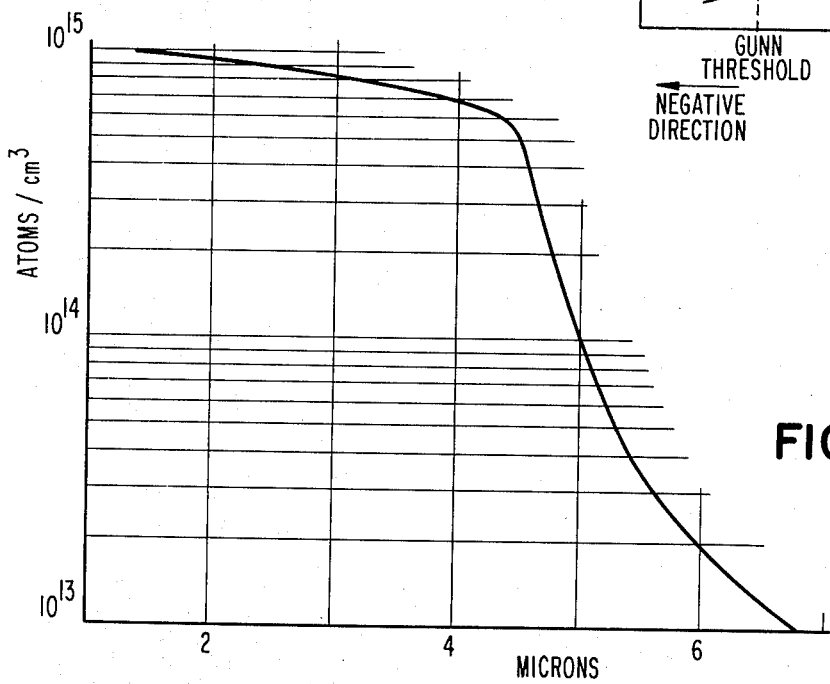
FIG. 8 is a graph of dopant concentration versus depth for an epitaxial layer of gallium arsenide used as part of the device of FIG. 4.

As will be recalled from the work of Gunn, if the field is above the Gunn threshold, domains form and instabilities occur in the I-V curve. However, by properly selecting the $n$ concentration of the Gunn layer and the gap width, $L$, domains will not form in the Gunn layer and no instabilities will result. Specifically, it has been demonstrated that domains will not form at voltages above the Gunn threshold if $n \cdot L < 1 \times 10^{12}$. This $n \cdot L$ product is the stability condition to prevent domain formation and thereby prevent Gunn oscillations. It should be noted that the dimension L is defined herein as the distance of the Gunn layer between two ohmically contacting conductors. For the case as described thus far, where the conductors are on a single surface of the Gunn layer, the dimension L is the distance of the surface Gunn layer between the two conductors, i.e., the width of the gap. The I-V curve of the transmission line is shown in FIG. 7. As is apparent there is no negative slope on the I-V curve. This might lead one to suspect that there would be no amplification by the device. However, in practice that is not the case. As it turns out, even though there is no true negative d.c. resistance, there is still a negative differential conductivity at the frequency corresponding to the reciprocal of the transit time and its harmonics, as explained previously. This negative differential conductivity results in amplification of the r.f. signal. Also, it should be noted that the invention operates independent of the polarity of the d.c. field. This feature makes the device particularly attractive as a microwave switch. Furthermore, it also has true transmission line amplification characteristics, e.g., the amplification is proportional to the length of the line. doping Several examples of the invention were constructed and tested utilizing chips of epitaxially grown gallium arsenide on a semi-insulating gallium arsenide substrate, made pursuant to applicant's specifications by Plessy Mfg. Co. of Great Britain. The substrate of all samples had a resistivity of $10^6 \Omega$-cm and the epi layer had a concentration, $n$, at the surface of $10^{15}$ atoms of dopant per $cm^3$. The epi layer thickness was $10\mu$ but the doping profile was such that the $n$ concentration dropped off sharply below $4\mu$ and thus the epi layer below $4\mu$ can be considered as semi-insulating. The actual doping profile is shown in FIG. 8. The $n$ concentration is plotted logarithmically on the ordinate, and the depth from the surface is plotted in microns on the abscissa. It should be noted that amplification is due to those regions of layer 12 which are biased on the negative slope of the drift velocity curve (see FIG. 11). An r.f. signal applied across the gap and travelling in the Z direction will penetrate downward one to two times the gap width. Because of the smaller E field at greater depths, as explained in connection with FIG. 6, a relatively large voltage would have to be applied across the gap to bias layer 12 above the Gunn threshold at depths of one to two times the gap width. Such relatively large voltages might cause breakdown at the surface of the gap. The advantage of using a doping profile such as shown in FIG. 12 is that the lower regions of layer 12, which are not biased above the treshold, are so low in conductivity that it appears as an almost lossless dielectric and does not reduce substantially the amplification caused by the active upper regions in the gap.

A procedure for growing gallium arsenide by vapor phase epitaxy onto a semi-insulating GaAs substrate is described by J. R. Knight et al. in "Solid State Electronics", pg. 178+ (1964). The dopant may be any suitable material which will dope GaAs n-type. Examples are sulfur, oxygen, selenium and tellurium.

The slices were degreased according to conventional techniques to clean them. Thereafter, the process varied for different ones of the chips. To understand the variations it will be necessary to first understand the input/output connections to the transmission line.

Figure 9:
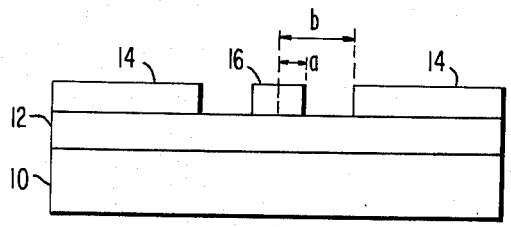
FIG. 9 is another cross-sectional side view of the device of FIG. 4.
Figure 10A:
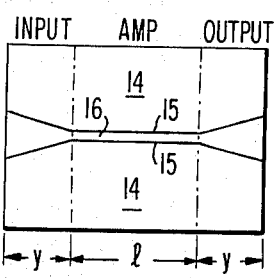
FIGS. 10–10A is a top view of a co-planar active medium propagation device with input and output sections.
Figure 10:
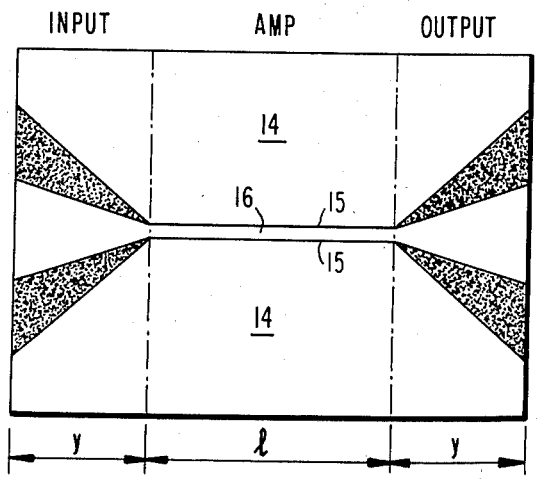

To achieve an $n \cdot L$ product of approximately $5 \times 10^{11}$, with a surface $n=10^{15}$ dopant atoms/$cm^3$, the gap dimension L is $5\mu$. Although gaps of such dimensions are quite small, they can be made according to state of the art photolithographic techniques. The transmission lines to be tested were of the co-planar variety, meaning they had a center conductor and two ground planes as shown in FIGS. 4 and 6. As is well known the characteristic impedance of a co-planar transmission line is a function of the ratio $a/b$, where $a$ and $b$ are the dimensions shown in FIG. 9. Since there is a lot of information available about $50\Omega$ transmission lines, it was decided to process the initial devices as $50\Omega$ transmission lines. The ratio $a/b$ was selected to provide a $50\Omega$ transmission line impedance on the assumption of a lossless dielectric. Since the gap width, L, was selected based on the $n \cdot L$ criteria, the width of the center conductor waas $7.0\mu$. Providing input and output connections to a conductor of several microns in width cannot be accomplished simply by soldering a wire connection to the line. Consequently, the chips were processed to have a top surface pattern as illustrated in FIG. 10. In the drawing the darkened areas represent gaps in the metallization. The center conductor and ground plane metallization are shown at 16 and 14, respectively, and the narrow $5\mu$ gaps are shown at 15. The active section or the AMP device per se is shown between the broken lines. The gap was flared at the input and output side of the chip to enable the transmission line to be connected to the outside world and to provide a reasonably smooth transmission impedance throughout the lengths of the input and output side. Samples were made varying the dimensions $l$ and $y$ to evaluate the properties of the line, where $l$ is the dimension of the active region in the Z direction (direction of propagation), and y is the dimension of the input and output sections as shown.

Also, in order to reduce the loss caused by the input and output section, samples were made with varying amounts of the epi layer etched away at the input and output sections. For example, a side view with epi removed is shown in FIG. 11. The amount of epi removed varied between $X = 4\mu$ to $X = 0$ (i.e., none removed). As will be recalled from the doping profile of the epi layer the epi layer became semi-insulating below $4\mu$. The experimental results bore out the expected result that input/output sections showed lower loss with increased $X$ or decreased $y$ (see FIG. 10) or a combination of both.

Where the epi in the input/output region was etched, the following process steps were used. The slice, after degreasing, was coated with a standard photoresist. Shipley negative resist AZ 1350 was used, but many others would be suitable. The photoresist was exposed to ultraviolet light through a mask and then developed. The developed photoresist was removed leaving a rectangular opening of dimension *l* parallel to the axis of the subsequently formed transmission line. The mask, as will be understood, had a rectangular pattern of dimension *l*. Next, tantalum was evaporated over the entire surface and lift-off photolithography was used to remove the remaining photoresist and the tantalum overlying said photoresist. Next, the tantalum was oxidized to form a layer of $Ta_2O_5$. These process steps are all known in the art and are not critical to the formation of the invention. The resulting device was a slice of gallium arsenide with a rectangular shaped layer of tantalum pentoxide over one portion thereof. A top view of the device at this stage is shown in FIG. 12. The tantalum pentoxide rectangle is shown at 30 overlying a portion of the epi layer 12. The oxide serves only as a mask against the chemical used to etch part of the epi layer. Many other masking materials would also be suitable, such as $SiO_2$, $Nb_2O_5$, etc.

The chip was then immersed in a chemical etchant to remove a desired amount of the epi in the input/output regions. The preferred etchant was a mixture of 1 part of NaOH, 4 parts $H_2O_2$ and 20 parts of water. The mixture etched the GaAs at the rate of $1.5\mu$ per minute.

One particular advantage of the mixture used is that is preferentially etches GaAs. In brief, that means that the etch rate along one crystalline boundary is faster than that along a second boundary. As a consequence, the resulting device has smooth slopes on two of the sides of the mesa as shown in FIGS. 13A, B and C. The advantage of a smooth slope for the sample which had a mesa region 40, is that there is better adherence of the metal conductors.

FIGS. 13A, B and C represent top, cross-sectional side and cross-sectional front views, respectively. For gallium arsenide crystals there are two cleavage planes which are 90° apart. The axes of the mesa are arranged perpendicular and parallel to the cleavage planes. This is accomplished by cleaving the GaAs slice prior to processing, and orienting the $Ta_2O_5$ mask so that one axis is perpendicular to the cleaved plane.

It can be seen from FIGS. 13B and 13C that edges 32 and 34 will be sloped whereas edges 38 and 36 will be etched inwardly. The reason this happens is because of the orientation of the gallium and the arsenic atoms in the crystal and the different etch rates the preferential etchant has depending upon the crystal orientation. It is desirable to have the sloped edges 32, 34 as the edges crossed by the center conductor 16, shown in FIG. 10. This can be accomplished by processing one of a plurality of slices which were made from the same GaAs ingot and checking the orientation of the sloping edges on the processed slice. The remaining slices can be oriented to provide slopes on the mesa edges which cross the long dimension, *l*, of the mesa. Following the formation of the mesa, the oxide rectangle was removed by conventional methods.

The above steps pertaining to the formation of the mesa, were not utilized for those samples which are processed flat, i.e., $X = 0$. All samples were processed similarly from thereon, except tha different mask patterns were used to provide samples with different active lengths, *l*, and different input/output lengths, *y*, (see FIG. 10). Furthermore, the individual steps are conventional. They include, in the order listed; applying a photoresist to the surface, exposing the photoresist to ultraviolet light through a mask having a pattern corresponding to the desired gap pattern shown in FIG. 10, developing the exosed photoresist, removing the developed photoresist, (this will leave a pattern of undeveloped photoresist corresponding in geometry to the desired gap geometry); evaporating the conducting layer, removing the remaining photoresist and the overlying metallization, and alloying the conductor layer to the GaAs.

As pointed out previously, one critical requirement is that the $n \cdot L$ product be such as to prevent domain formation (this applies only to the active region and not to the input/output regions). Another cricital requirement is that the metal layer, consisting of the center conductor 16 and the ground planes 14, form an ohmic contact with the Gunn semiconductor layer.

Processes for forming ohmic contacts to III-V semiconductor compounds, particularly n-type GaAs, are known in the art. Reference is made to the following publications for a teaching of suitable conductor metal and the process of applying the metals to the semiconductor:
1. "Metal-Semiconductor Contacts for GaAs Bulk Effect Devices", by Braslau, Gunn and Staples, Solid-State Electronics, Pergamon Press, 1967, Vol. 10, pp. 381-383;
2. "Contact Resistance of Au—Ge—Ni, Au—Zn and Al to III-V Compounds", by Shih and Blum, Solid-State Electronics, Pergamon Press, 1972, Vol. 15, pp. 1177-1180.

The preferable contact material for layers 14 and 16 is an alloy of Au — Ge — Ni. The latter material is in alloy form prior to evaporation onto the GaAs surface. Also, it should be noted from the above articles, that after the desired pattern is formed in the contact metal, the contact metal is alloyed to the GaAs by heating the device.

The devices fabricated were subjected to gain and noise measurements which bore out that the invention; (1) is an amplifying transmission line, (2) is not transit time limited in the direction or propagation, (3) exhibits increased amplification with increased length, and (4) is low in noise.

Initial tests were performed with a r.f. of 20GHz. The d.c. field was applied as continuous d.c. in some tests and as a pulsed d.c. field, to present overheating, in other tests. It will be appreciated by anyone of ordinary skill in the art that the addition of a suitable heat sink is desirable to prevent overheating. The pulse width of the pulsed d.c. was approximately 1.0 microseconds. Relative to a 20 GHz signal, a width of 1.0 microseconds looks continuous.

Experiments were carried out on devices, several of which had active lengths, *l*, of $250\mu$ and others which had active lengths of $1250\mu$. At zero field, i.e., $E=0$, the device was lossy as would be expected because of the imperfect dielectric medium (i.e., *n* doped GaAs). Furthermore, as expected the amount of loss was dependent upon the length. The loss over the entire chip, including input/outpt sections was reduced substantially for greater values of *x* (increased etching of the epi in the input/output regions). This also was expected because when one removes the first few microns of the epi, the GaAs in the input/output regions has a much lower conductivity.

When the E field was applied, the loss decreased, and at voltages which resulted in an E field across the gap equal to twice the Gunn threshold, the active length provided gain. The gain increased with higher E field. A plot of applied voltage versus gain in the active region is illustrated in FIG. 14. The three devices plotted and designated CTI No. 4, CTI No. 3 and CT 3 all had active lengths of 250μ. CT 3 was processed flat with $X = 0$, whereas CTI No. 4 and CTI No. 3 was processed with $X=1.0\mu$ and $1.5\mu$, respectively. For the gap width, L, of $5\mu$, the Gunn threshold of 3,000 v/cm is reached at $V_{dc} = 1.5$ volts. It can be seen from FIG. 14 that the device began to amplify at values of voltage near twice the Gunn threshold. It should be noted that the Gunn threshold must be exceeded for amplification to occur. The reason why it had to be exceeded significantly in the gap, was to insure that it was also exceeded at the lower depths of the epi, as indicated diagrammatically in FIG. 6. The necessary condition for amplification is that enough of the Gunn layer, through which the r.f. propagates, is on the negative slope of the $V_e$ curve (FIG. 1) for the r.f. to see a negative differential conductivity.

The devices processed with $l = 250\mu$ had overall chip lengths $(l + 2y)$ of $1,000\mu$. The device processed with $l = 1,250\mu$ had overall chip lengths of $2,500\mu$. For devices of the first category, with $X = 0$, the overall chip loss at zero d.c. field was 16 dB. Thus, the expected loss for a similar device of the second category would be about 40 dB ($2.5 \times 16$ dB). The measurements bore this out. A device of the second category, with $X = 0$, experimentally showed a zero field loss of 38.6 dB.

Devices of the second category had lengths five times greater than those of the first category. Experimental results showed that they also had gains in dB of near five times that of the shorter ones. At 7.5 volts the longer devices showed gains in the active region of 14.2 dB, which is approximately five times that for the shorter devices at 7.5 volts bias. A further improvement as shown in FIG. 10A has resulted by fabricating the devices in a manner similar to that shown in FIG. 10, but instead of flairing the gap widths and the gap separation, only the separation between adjacent gaps was flaired. The resulting devices did not have uniform transmission line impedance in the so-called input/output areas but showed improvement because the active area was lengthened to include that part previously used only as the input/output area.

The noise figure measurements made thus far indicate that the noise figures of the active regions are equal to or less than 6 dB. This means that the planar transmission line provides gain in the same range with Gunn diodes and IMPATT devices but is lower in noise.

It should be noted that one can experimentally determine if any device has a low enough $n \cdot L$ to prevent domain formation by simply measuring the I-V characteristic and noting whether instabilities occur above the Gunn threshold. Experience indicates that an $n \cdot L$ product of $1 \times 10^{12}$ will be too high, but anything less than about $1 \times 10^{12}$ should be sufficient. Furthermore, the figure should be independent of the Gunn material used.

A slot line configuration of the invention is shown in FIG. 15. The substrate 60 and the Gunn semiconductor layer 62 may be the same as in the co-planar configuration. The two conductors 64 and 66 form ohmic contacts with the Gunn layer 62. Since a center conductor is not used in the slot line configuration, the problems of connecting the line to the outside world are not as great as in the co-planar configuration. A coaxial line 68 may be used to connect the r.f. and the d.c. to the input ports of the transmission line. The center conductor 72 of the coax 68 is connected to conductive plane 72 whereas the outer conductor 70 of coax 68 is connected to the conductive plane 64. A coax may also be used to pick off the r.f. at the output port 74.

As an alternative, microstrip transmission line may be used to couple the r.f. to a slot line transmission line as shown in FIG. 16. The same numerals are used in FIGS. 15 and 16 to designate identical elements. Instead of a coax, the input device of FIG. 16 is a microstrip line 80. In this configuration the conductor 64 serves also as the ground plane of the microstrip 80. The dielectric and other conductive planes are illustrated at 76 and 78, respectively. In this case the r.f. would be gap coupled from the microstrip into the gap of the slot line. The output could be picked off by a coax at output 74. The d.c. can be applied via simple wire connectors to conductive planes 64 and 66.

Parallel slot lines constructed according to the description herein could be used in combination with a waveguide to provide amplification. For example, a device comprising parallel slot lines is shown in FIG. 17. The device in FIG. 17 is identical in all respects to FIGS. 15 and 16, except that there are three slot lines in parallel. The Gunn semiconductor layer 62 overlays a substrate 60 and has conductor layers 102, 104, 106 and 108 thereon forming ohmic contact to the Gunn layer. The three gaps form three devices in parallel. Each of the conductors 104 and 106 serve as conductors for a pair of slot lines. The d.c. bias may be applied by connecting one terminal of a d.c. source to conductors 102 and 106, and by connecting the other terminal of the d.c. source to conductors 104 and 108. Alternatively, the d.c. bias may be applied by connecting the d.c. source across conductors 102 and 108. In the latter configuration the total d.c. voltage will distribute itself across the gaps 110, 112 and 114.

The invention may be used as a reflecting transmission line. This can be accomplished by providing an r.f. short or an r.f. open at the output port thereby causing the propagating r.f. to be reflected at the output port back toward the input port. The r.f. will thus be amplified both during propagation from input port to output port and during propagation from the output port to input port. Typically, such a device would be coupled to one port of a three port circulator, the other two ports serving as input and output ports, respectively, of the reflecting transmission line circuit.

One manner of using the parallel slot line of FIG. 17 with a rectangular waveguide is shown in FIGS. 18 and 19, representing top and front views, respectively. The parallel slot line 120 is positioned in a narrowed region 124 of rectangular waveguide 122. An r.f. signal is coupled to waveguide 122 to provide an r.f. E field, 128, parallel to the surface of device 120. The constricted region 124 concentrates the r.f. E field which distributes across the gaps as shown by arrows 130, on the output side. Each slot line amplifies a divided part of the r.f. At the output of the rectangular, waveguide the r.f. will be amplified due to the action of the parallel slot lines 120.

Alternatively, the parallel slot line 120 could be used to reflect and amplify the r.f. in a rectangular waveguide as shown in FIG. 20. In this case, the gaps of the parallel slot line 120 are arranged perpendicular to the r.f. E field in the waveguide 132. Instead of travelling down the gap, the r.f. E field travels into the bulk perpendicular to the gap, and then into a quarter wave short 133. The r.f. is reflected by the short back to the parallel array. The signal is amplified while travelling in the device. As indicated by arrow 135 the quarter wave short may be tuned for the center frequency of interest.

What is claimed is:

1. A planar transmission line amplifier comprising; a Gunn semiconductor layer selected from the group consisting of gallium arsenide, indium phosphide, zinc telluride, cacmium telluride, indium arsenide under mechanical stress, and germanium at temperatures below 17°K, said layer consisting of a substrate portion and an epitaxial portion, said epitaxial portion having a dopant concentration, $n$, from a surface of said epitaxial layer down to approximately 4 $\mu$m from said surface and sharply decreases thereafter; at least two conductive plates ohmically contacting said epitaxial surface and being spaced to form a gap of width L therebetween, whereby the product $n \cdot L$ is less than $1 \times 10^{12}$ atoms/cm$^2$; an input port consisting of the first adjacent ends of said conductive plates, and output port consisting of the second, opposite, ends of said conductive plates; means for applying a voltage between said two conductive plates equal to a value sufficient to create an E field in the surface of said gap equal to approximately twice the Gunn threshold of said semiconductor layer; and means for applying an r.f. signal to said input port to cause said r.f. signal to propagate in a direction perpendicular to said E field vector.

2. A planar transmission line amplifier as claimed in claim 1 wherein said gunn semiconductor layer is gallium arsenide.

3. A planar transmission line amplifier as claimed in claim 1 further comprising a third conductive plate ohmically contacting said surface of said Gunn semiconductor layer, said first, second and third conductive plates constituting the ground plane, center conductor, and ground plane, respectively, of a co-planar transmission line having gap widths of dimension L.

4. A planar transmission line amplifier as claimed in claim 3, wherein said center conductor and said ground planes comprise an alloy of gold, germanium and nickel.

5. A planar transmission line amplifier as claimed in claim 3, wherein said means for applying an r.f. signal comprises:
an extension of said Gunn layer and said center conductor and ground planes from an input end of said gaps of dimension, L, the center conductor and ground planes having geometries to define gradually increasing widths of said gaps and said center conductor away from said input end to permit easy connecting of signals to said center conductor and ground planes.

6. A planar transmission line amplifier as claimed in claim 5 further comprising an extension of said Gunn layer and said center conductor and ground planes from an output end of said gaps of dimension, L, said latter extension being substantially identical to the extension from said input end.

7. A planar transmission line amplifier as claimed in claim 6 wherein the surface of both said extensions have been etched to provide a mesa region of said Gunn layer extending for length $l$ coincident with the length $l$ of said gaps of dimension, L, and where the surface concentration of dopant atoms is greater on said mesa than on said extended portions of said Gunn layer.

8. A planar transmission line amplifier as claimed in claim 1 wherein said means for applying an r.f. signal comprises a microwave coaxial conductor, the center conductor of which is connected to one of said conductive planes adjacent the input end of said gap, and the outer conductor of which is connected to the other of said conductive plane adjacent the input end of said gap.

9. A planar transmission line amplifier as claimed in claim 1 wherein said means for applying an r.f. signal comprises a microstrip transmission line incorporating one of said conductive planes as the ground plane thereof and extending across said gap at the input end of said planar transmission line.

10. A planar transmission line amplifier as claimed in claim 3, wherein said means for applying an r.f. signal comprises:
an extension of said Gunn layer and said center conductor and ground planes from an input end of said gaps of dimension, L, the center conductor and ground planes have geometries to define a gradually increasing center conductor and constant width of said gaps away from said input end to permit easy connecting of signals to said center conductor and ground planes.

11. A planar transmission line amplifier as claimed in claim 10 further comprising an extension of said Gunn layer and said center conductor and ground planes from an output end of said gaps of dimension, L, said latter extension being substantially identical to the extension from said input end.

12. A planar transmission line amplifier as claimed in claim 11 wherein the surface of both said extensions have been etched to provide a mesa region of said Gunn layer extending for length $l$ coincident with the length $l$ of said gaps of dimension, L, and where the surface concentration of dopant atoms is greater on said mesa than on said extended portions of said Gunn layer.

* * * * *

UNITED STATES PATENT AND TRADEMARK OFFICE
CERTIFICATE OF CORRECTION

PATENT NO. : 3,975,690
DATED : August 17, 1976
INVENTOR(S) : PAUL L. FLEMING

It is certified that error appears in the above-identified patent and that said Letters Patent are hereby corrected as shown below:

Column 1

Line 32, delete "$\sqrt{\varepsilon} c \ell$" and insert -- $\sqrt{\varepsilon_c}\, \ell$ --

Line 40, delete "$c\omega$" and insert -- $\frac{\omega}{c}$ --

Line 56, delete "$\delta$" and insert -- $\sigma$ --

Line 66, delete "+jLm" and insert --+jLm--

Line 67, delete "(Re + jLm)$\ell$" and insert

--(R$_e$ + jLm)$\ell$ --

Column 3

Line 19, delete "$\delta$" and insert --$\sigma$ --

Line 51, delete "vEdx" and insert --$\int$ Edx--

Column 6

Line 23, reference to "FIGS. 18 and 19" should be a separate paragraph.

UNITED STATES PATENT AND TRADEMARK OFFICE
CERTIFICATE OF CORRECTION

PATENT NO. : 3,975,690
DATED : August 17, 1976
INVENTOR(S) : PAUL L. FLEMING

Page 2 of 3

It is certified that error appears in the above-identified patent and that said Letters Patent are hereby corrected as shown below:

Column 7

LineLine 39, delete "doping"

Line 67, delete "treshold" and insert --threshold--

Column 9

Line 22, delete "NaOH" and insert --NH$_4$OH--
Line 61, delete "tha" and insert --that--

Column 10

Line 1, delete "exosed" and insert --exposed--

Line 39, after "direction" delete "or" and insert --of--

Line 44, delete "present" and insert --prevent--

Line 59, delete "x" and insert --X--

Column 11

Line 4, delete "was" and insert --were--

Line 20, delete "device" and insert --devices--

Line 7, after "alternative," insert --a--

UNITED STATES PATENT AND TRADEMARK OFFICE
CERTIFICATE OF CORRECTION

PATENT NO. : 3,975,690

DATED : August 17, 1976

INVENTOR(S) : PAUL L. FLEMING

It is certified that error appears in the above-identified patent and that said Letters Patent are hereby corrected as shown below:

Column 11

Line 60, after "rectangular" delete the comma.

Column 13

Line 10, delete "cacmium" and insert --cadmium--

Line 32, delete "gunn" and insert --Gunn--

Signed and Sealed this

Fourteenth Day of December 1976

[SEAL]

Attest:

RUTH C. MASON
Attesting Officer

C. MARSHALL DANN
Commissioner of Patents and Trademarks